United States Patent [19]

Michael

[11] Patent Number: 5,548,326
[45] Date of Patent: Aug. 20, 1996

[54] EFFICIENT IMAGE REGISTRATION

[75] Inventor: David Michael, Newton, Mass.

[73] Assignee: Cognex Corporation, Natick, Mass.

[21] Appl. No.: 299,015

[22] Filed: Aug. 31, 1994

Related U.S. Application Data

[63] Continuation-in-part of Ser. No. 132,532, Oct. 6, 1993, abandoned.

[51] Int. Cl.$^6$ ..................................................... H04N 7/18
[52] U.S. Cl. .............................. 348/87; 348/94; 348/126; 382/151
[58] Field of Search .................................. 348/86, 87, 90, 348/92, 94, 95, 126; 382/145, 146, 147, 149, 150, 151; H04N 7/18

[56] References Cited

U.S. PATENT DOCUMENTS

| | | | |
|---|---|---|---|
| 4,240,750 | 12/1980 | Kurtz | 356/394 |
| 4,347,964 | 9/1982 | Takasugi | 228/4.5 |
| 4,421,410 | 12/1983 | Karasaki | 356/378 |
| 4,439,010 | 3/1984 | Doty | 359/630 |
| 4,441,248 | 4/1984 | Sherman | 437/8 |
| 4,799,175 | 1/1989 | Sano | 364/552 |
| 4,805,123 | 2/1989 | Specht et al. | 348/126 |
| 4,855,928 | 8/1989 | Yamanaka | 364/489 |
| 4,860,371 | 8/1989 | Matsuyama et al. | 348/126 |
| 5,138,180 | 8/1992 | Yamanaka | 250/559.07 |
| 5,156,319 | 10/1992 | Shibasaka | 228/9 |
| 5,170,062 | 10/1992 | Miyahara | 250/559.07 |
| 5,225,891 | 7/1993 | Choumei | 356/376 |

OTHER PUBLICATIONS

ACM Computing Surveys, vol. 24, No. 4, Dec. 1992, "A Survey of Image Registration Techniques," 27 pp.
IEEE Transactions on Computers, vol. C–21, No. 2, Feb. 1972, "A Class of Algorithms for Fast Digital Image Registration," 8 pp.

*Primary Examiner*—Howard W. Britton
*Attorney, Agent, or Firm*—Russ Weinzimmer

[57] ABSTRACT

A method and apparatus for efficient registration of a pair of digitized images is provided that obtains a registration metric value based upon a Sum of Absolute Differences registration metric computation for each of a plurality of neighboring-pixel relative displacements, and, for example, iteratively selects a new initial relative displacement from among the plurality of neighboring-pixel relative displacements such that each succeeding new initial relative displacement is associated with a smaller registration metric value, until an initial relative displacement that is associated with a minimum registration metric value is reached. In general, the relative displacement that is associated with the minimum registration metric value is located using a two-dimensional numerical optimization analysis. The invention is especially useful for flaw and defect analysis, such as Golden Template Analysis, third optical inspection, as well as for pair-wise comparison of die images on a semiconductor wafer.

33 Claims, 5 Drawing Sheets

EFFICIENT IMAGE REGISTRATION

CROSS-REFERENCES TO RELATED APPLICATIONS

This application is a continuation-in-part of application Ser. No. 08/132,532 filed on Oct. 6, 1993, abandoned.

FIELD OF THE INVENTION

This invention relates generally to machine vision, and particularly to registration of digitized images acquired by a machine vision system.

BACKGROUND OF THE INVENTION

Accurate and efficient registration is important in a variety of contexts. For example, many phases of microelectronic fabrication require some form of alignment and/or registration, i.e., precise relative positioning. From photolithography through final packaging of a semiconductor chip, high yield depends on the precise relative positioning of semiconductor components and production equipment. In particular, alignment and/or registration techniques play a key role in mask registration, stepping, dicing, die picking, die bonding, wire bonding, and optical inspection, for example. Thus, improvements in the speed, precision, and repeatability of alignment and registration systems can directly improve productivity.

Machine vision technology can provide greater speed and accuracy than standard registration techniques by first representing the objects to be registered by corresponding digitized or quantized images. The digitized images of the objects to be registered are captured by a video camera, and are then compared using digital image analysis.

Mathematically, an image is a discrete, two-dimensional function $I(x,y)$, where the value of the function at each point $(x,y)$ represents one of a plurality of possible shades of gray. Both the coordinates x and y and the shades of gray are represented by integers that fall within a range of values, i.e., are quantized. Typically, an image is a rectangle having a width and a height. Each point $(x,y)$ in the image $I(x,y)$ is called a "pixel", and is associated with a quantized gray value, e.g., an integer $I(x,y)$ that is falls within the range $0 \leq I(x,y) \leq 255$. The quantized gray value of each pixel is usually a function of the radiance (power per unit solid angle per unit projected area) of a corresponding point in the scene that the image represents.

A "model" or "template" is similar to an image, except that it need not be rectangular, or even simply connected, i.e., it may consist of a collection of regions. A model can be treated like an image where each pixel in a rectangular region that includes the collection of regions can be assigned a gray value when the pixel is within one of the regions, or a "don't care" symbol when the pixel is not within one of the regions. Note that a "don't care" symbol is not the same as a zero.

Alignment shall be defined as orienting a first object with respect to a second object so as to make at least one alignment parameter of the first object, such as planar position or angular orientation, substantially equal to the corresponding alignment parameter of the second object. For example, a collection of pencils on a desk are aligned when they are all oriented in the same direction. Alternatively, given two sheets of paper on the desk, each having a dot printed thereon, the dots are aligned when a dot of the first sheet overlays a dot on the second sheet, i.e., the dots occupy the same projective position, regardless of the relative rotational orientation of the two sheets.

Registration of a pair of objects shall be defined as orienting a first object with respect to a second object so as to make all alignment parameters of the first object substantially equal to the corresponding alignment parameters of the second object. For example, a first semiconductor fabrication mask is said to be registered with an overlaying second semiconductor fabrication mask when either a single fiducial mark on the first mask is located at the same projective position as the corresponding fiducial mark on the second mask, or more than one fiducial on the first mask is aligned with respect to the corresponding fiducial mark on the second mask.

Alternatively, alignment can be defined as imprecise registration. For example, an alignment step for coarse relative positioning can be followed by a registration step to achieve fine, or more precise relative positioning.

A known approach commonly used for registration of digitized images is called "normalized correlation". In the fields of pattern recognition and machine vision, "correlation" refers to the degree of similarity between a first image and a second image, where it shall be assumed that an "image" is a digitized, monochromatic rendition of an object. For purposes of registration, even two identical images are deemed to be dissimilar if they are not registered, due to the nature of the computation of the correlation coefficient, as will be discussed below. Moreover, the correlation coefficient indicates the degree of misregistration between the two images.

The correlation coefficient r of a first image M and a corresponding portion of a second image I at an offset $(u,v)$ is given by:

$$r(u,v) = \frac{\left[ N \sum_i I_i M_i - \left(\sum_i I_i\right)\left(\sum_i M_i\right) \right]}{\sqrt{\left[ N \sum_i I_i^2 - \left(\sum_i I_i\right)^2 \right]\left[ N \sum_i M_i^2 - \left(\sum_i M_i\right)^2 \right]}} \quad (1)$$

where $I_i = I(u+x_i, v+y_i)$. The value of $r(u,v)$ is always in the range: $-1 < r(u,v) \leq 1$. A value of 1 or $-1$ signifies a "perfect match" of a first image with a second image.

Two version of the normalized correlation coefficient $n(u,v)$ are given by:

$$n(u,v) = r^2(u,v) \quad (2a)$$

or $$n(u,v) = \max(r(u,v),0)^2 \quad (2b)$$

In equation (2b), the "max" function forces all negative values of $r(u,v)$ to 0.

The normalized correlation function of a pair of images is the set of correlation values at all positions $(u,v)$ such that $I_i$ is a valid image pixel for all values of i. The correlation function will typically be a rectangular array of correlation values.

Assuming neither image of the image pair to be registered is flawed, registration of the two images of the image pair is achieved when the relative displacement of the two images causes the function $n(u,v)$ to be maximized. Perfect registration requires that the local maximum also be the global maximum. The global maximum of the function $n(u,v)$ is the point where $n(u,v)$ takes on its largest value over all allowed values of u and v. A local maximum of $n(u,v)$ is a point where the value of $n(u,v)$ is larger than any of the values in some defined neighborhood of the point. Thus, the global maximum is also a local maximum. Multiplying n(u,v) by −1 has the effect of converting all local maxima into local minima, and all local minima into local maxima.

The use of normalized correlation for registration of a first image with respect to a second image is problematic when at least one of the images is flawed. An image is deemed to be flawed when it does not accurately represent the object it was intended to represent. For example, a flawed image can result from aberrant illumination of the object, such as lighting that creates a dark shadow or an excessively bright spot due to a highly reflective portion of the object. A flawed image of an object can also result when the object is obscured by another object. Also, if the object itself is flawed, such as might result from a processing or other manufacturing error, a flawed image results. In this case, the flawed image may accurately represent the flawed object, but nevertheless deviates from the image of what an unflawed object would be.

When at least one of the images to be registered is flawed, registration based on normalized correlation results in either poor registration, or misregistration, i.e., most of the features that can be found in both images are not in registered relationship. It obvious that if a feature is absent from a flawed image, it is impossible to register it with a corresponding feature in the other image. Nevertheless, it is desirable that a registration method provide substantial registration of all of the features common to both images, even when one of the images to be registered is flawed.

SUMMARY OF THE INVENTION

An efficient registration method and apparatus provides substantial registration of all of the features common to a pair of images to be registered, even when one of the images to be registered is flawed.

The invention features the use of a registration metric based on minimization of the sum of the absolute value of the differences between a first image and a second image to be registered with respect to the first image. Also employed is an efficient optimization technique, such as a version of gradient descent, wherein a local minimum in a registration metric space is found to the nearest pixel using less computational resources than needed to compute the entire registration metric space. In a preferred embodiment, registration to sub-pixel accuracy can be obtained using a sub-pixel interpolation technique.

The invention is well-suited for use in flaw and defect detection applications, such as Golden Template Comparisons, pre- and post-process optical inspection, and inspection of arrays of repeated geometrical designs, wherein after registration is performed, a difference image is derived by computing the difference between each pair of corresponding pixels of the registered image pair.

BRIEF DESCRIPTION OF THE DRAWINGS

The invention will be more fully understood from the following detailed description, in conjunction with the accompanying figures, wherein.

DETAILED DESCRIPTION OF THE DRAWINGS

Figures 1A, 1B, 2:
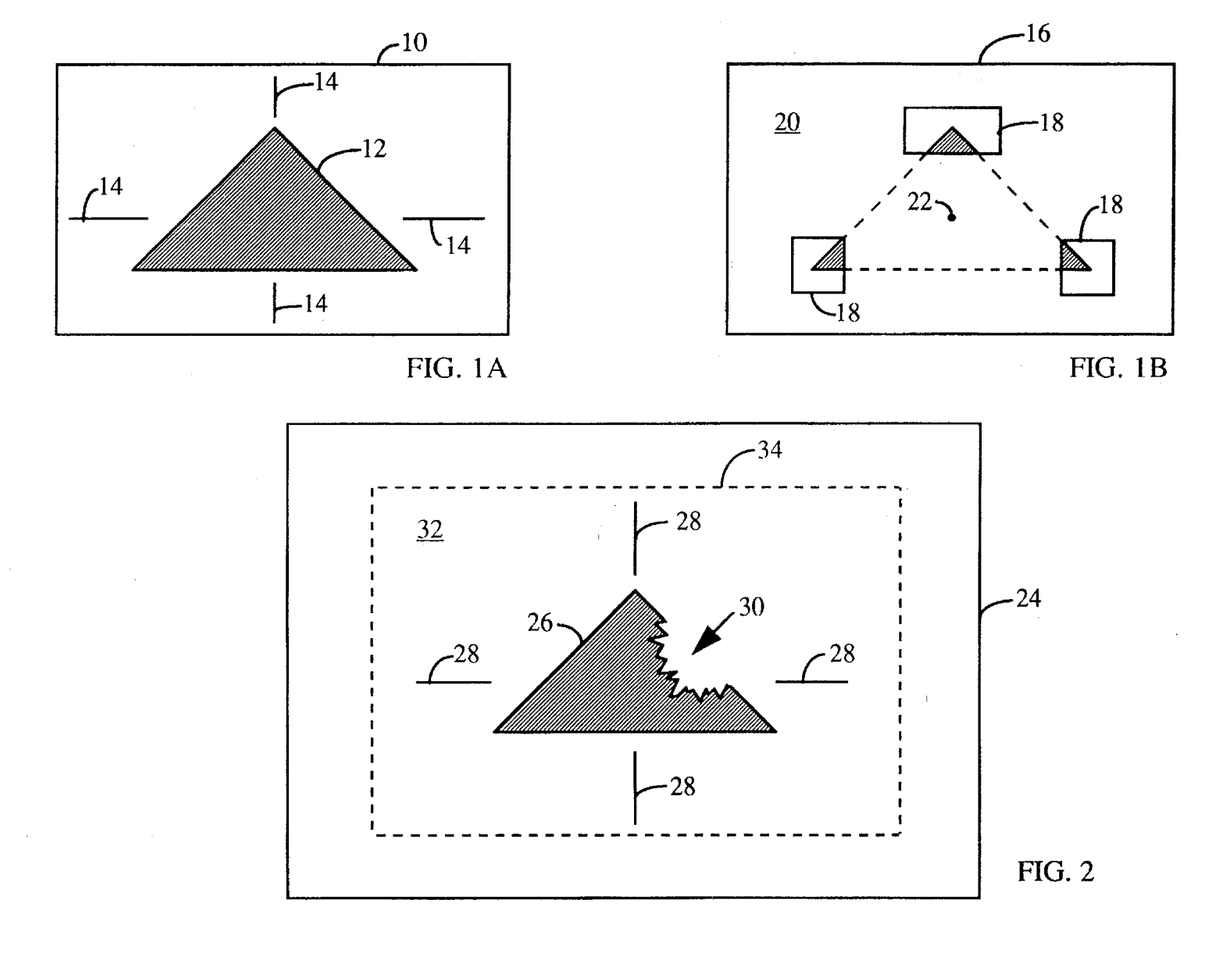
FIG. 1A is a representation of a rectangular binary first image of a triangle, and a pair of orthogonal cross-hairs indicating the location of the centroid of the triangle.
FIG. 1B is a representation of a rectangular binary first image that includes a plurality of portions of the image of FIG. 1A, each portion being enclosed within a window, the remainder of the image being a "don't-care" region, and a dot indicating the location of the centroid of the triangle.
FIG. 2 is a representation of a flawed rectangular binary second image of a triangle, and a pair of orthogonal cross-hairs indicating the location of the centroid of the triangle.

With reference to FIG. 1, a representation of a rectangular binary first image 10 of a triangle 12 is shown. Although the image 10 is binary, the method and apparatus of the invention can be applied to images having pixels associated with more than one of two possible gray levels, e.g., one of 256 gray levels. In fact, the method and apparatus of the invention is even better-suited for use with such "gray scale" images. Thus, the image 10 is binary solely for illustrative purposes, and is not intended to limit the scope or applicability of the present invention.

The triangle 12 is characterized by a centroid, the position of which is indicated by the intersection point of a pair of orthogonal cross-hairs 14. In the case of a planar figure such as the triangle 12, the centroid corresponds to the center of mass of a similarly shaped thin plate of uniform thickness and consistency. The centroid of the triangle 12 can be used to determine a convenient initial relative displacement with respect to a second image to be brought into registered relationship by overlaying the centroid of the second image with the centroid of the triangle 12. Alternatively, other points in an image can be used to determine a convenient initial relative displacement, such as the point defined by the position of the cross-hairs 14 wherein an equal number of pixels falls on each side of each cross-hair 14, for example.

Referring to FIG. 1B, a representation of an alternate rectangular binary first image 16 is shown that includes a plurality of portions of the image 10 of FIG. 1A, each portion being enclosed within a window 18. The remainder of the image 16 is a "don't-care" region 20 which includes "don't care" pixels that are excluded from consideration when registration is determined according to the present invention. A dot 22 indicates the location of the centroid of the image 16. FIG. 1B is included to illustrate that the method and apparatus of the present invention can be applied to an image that includes a "don't-care" region.

FIG. 2 shows a flawed rectangular binary second image 24 of a triangle 26, and a pair of orthogonal cross-hairs 28 indicating the location of the centroid of the triangle 26. For illustrative purposes, the triangle 26 includes a flaw 30, such as a missing portion, an overlap, or any other substantial deviation from the intended ideal image shape, such as a specularity (a highly reflective region of the object represented by the image), or a lens flare.

A search area 32 within the image 24 is defined by a search area boundary 34. The search area 32 is the area of the second image 24 over which the first image 10 can be displaced for bringing the first and second images 10 and 24 into registered relationship. Although the centroid of the triangle 12 can be used to determine a convenient initial relative displacement of the first image 10 with respect to the second image 24 for bringing the first and second images into registered relationship, the first image 10 can be initially displaced anywhere within the search area 32, provided that the image 10 does not extend at all beyond the boundary 34. Even if optimum registration can be achieved by displacing the first image 10 with respect to the second image 24 such that a portion of the first image does extend beyond the boundary 34, in a preferred embodiment of the invention, the coordinates of the first image 10 are returned as the resulting registration parameters when a portion of the first image extends over the boundary 34 as a result of a gradient descent, or other two-dimensional numerical optimization approach.

Figure 3:
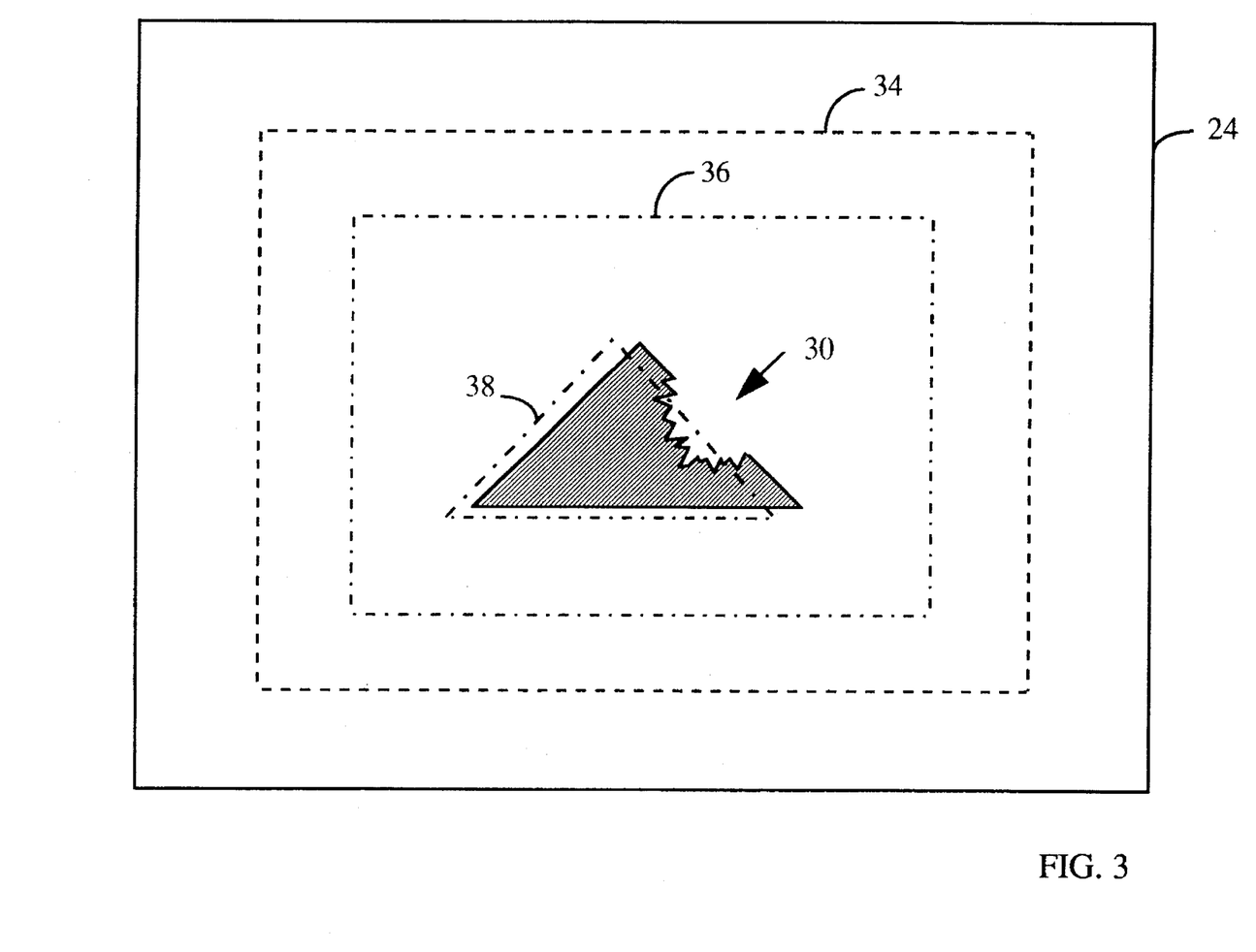
FIG. 3 is a phantom of the rectangular binary first image of a triangle of FIG. 1 superimposed and relatively displaced with respect to the representation of the rectangular binary second image of the triangle of FIG. 2, also showing a search area within the second image.

FIG. 3 shows a phantom 36 of the rectangular binary first image 10, having a phantom triangle 38 corresponding to the triangle 12, superimposed upon and displaced relative to the rectangular binary second image 24 such that the centroid of the phantom 36 overlays the centroid of the second image 24. Note that the phantom image 36 falls within the search area 34 of the second image 24.

An objective of the invention is to bring the first image 10, as indicated by the phantom image 36, into registered relationship with the second image 24, even though the second image 24 includes the flaw 30. One advantage of the present invention is that the effect of image flaws is minimized, as compared with prior art approaches, such as Normalized Correlation, which tends to exaggerate the effect of image flaws, resulting in failed registration attempts.

The effect of image flaws is minimized, as compared with prior art approaches, such as Normalized Correlation, due to the use of a metric that is linear in the gray values of the pixels of the images to be registered. For example, a useful metric is the Sum of Absolute Differences (SAD) metric.

The Sum of Absolute Differences SAD(u,v) of a first image M and a corresponding portion of a second image I at an offset (u,v) is given by:

$$SAD(u,v) = \sum_i | I_i - M_i | \quad (3)$$

where $I_i = I(u+x_i, v+y_i)$.

Note that in contrast with the metric used in Normalized Correlation, shown in equation (1), the Sum of Absolute Differences metric does not include any squared terms. Although squared terms do confer certain advantages, as recognized by the prior art, it is a contribution of the present invention to recognize that squared terms in an image registration metric can often result in erroneous registration when one or both of the images to be registered include one or more image flaws. As also recognized by the invention, the squared terms result in an excessive sensitivity to image flaws that impedes or precludes registration.

Also note that the Sum of Absolute Differences metric can be modified by including a normalization factor, such as one based on the average gray values of the first and second images, without introducing the problems associated with non-linearities, such as the squared terms of the Normalized Correlation metric. One feature of a normalized Sum of Absolute Differences metric is that such a metric is insensitive to constant changes in image brightness.

Moreover, in the prior art, the Normalized Correlation metric is sometimes used in conjunction with a training step for one of the images that consumes computational time. By contrast, the invention employs the Sum of Absolute Differences metric such that there is no need for a training step. Thus, there is no computational time penalty for exchanging one or more of the images to be registered for each alignment step in a sequence of alignment steps.

Figure 4:
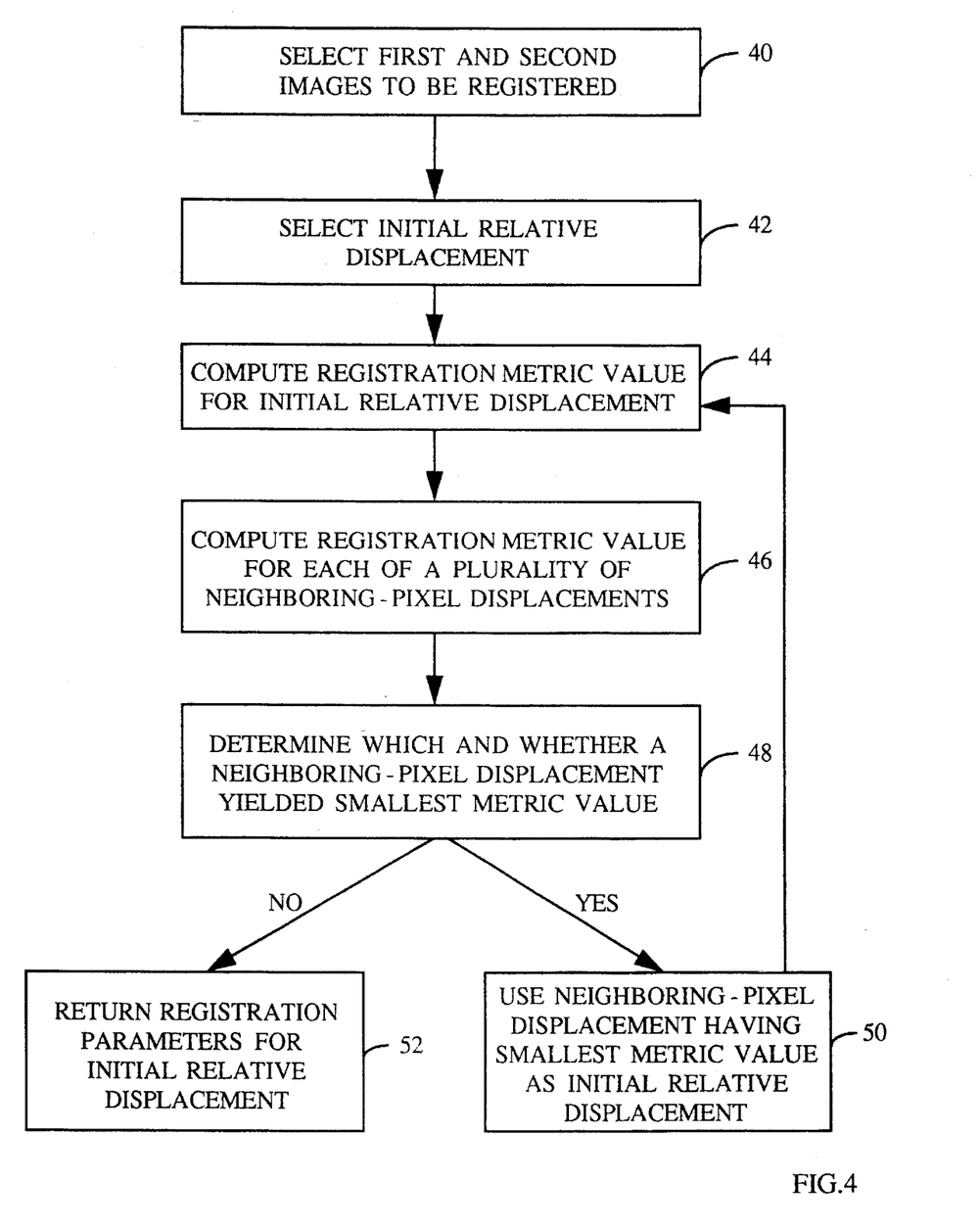
FIG. 4 is a flow chart of a preferred embodiment of the method of the invention.

Referring to FIG. 4, to efficiently register a pair of digitized images, each including a plurality of pixels, each pixel being associated with at least a gray value or a don't-care symbol, the invention provides a method and apparatus that employs the Sum of Absolute Differences metric of Equation (3), and a two-dimensional numerical optimization technique, such as gradient or steepest descent. In particular, the first step (40) of the method is to select the first and second images to be registered. The first image can be any gray-scale image, including a binary image, such as the black-and-white image 10. The first image can also include regions of "don't-care" pixels that surrounds each of a plurality of windows that each enclose a plurality of gray-scale pixels. The windows can overlap, and there is no restriction on the number of windows. The "don't-care" regions can be arranged so that the image selected does not include certain predictable image flaws, such as a recurring specularity, thereby improving registration performance. Nevertheless, sometimes it is not possible to compensate for image flaws using don't-care regions. In such instances, the invention is particularly useful.

The next step (42) includes selecting an initial relative displacement between the first image 10 and the second image 24 such that a plurality of pixels of the first image 10 are in overlapping relationship with a plurality of pixels of the second image 24. One way to accomplish this is to overlay the centroid of the first image upon the centroid of the second image. Another approach is to find the geometric center of each image, and overlay the center of the first image on the center of the second image. Any other approach that ensures that a plurality of pixels of the first image are in overlapping relationship with a plurality of pixels of the second image would also be effective. If an a priori best estimate of the correct registration to the nearest pixel is available, it is preferable to use it as the basis for the initial relative displacement. In another preferred embodiment, a search area within the second image is defined. For example, a search area may be chosen that allows misregistration of up to ±2 pixels in the x direction and ±5 pixels in the y-direction. Preferably, the two images should be relatively displaced such that each pixel of the first image falls within the search area of the second image.

Figure 5:
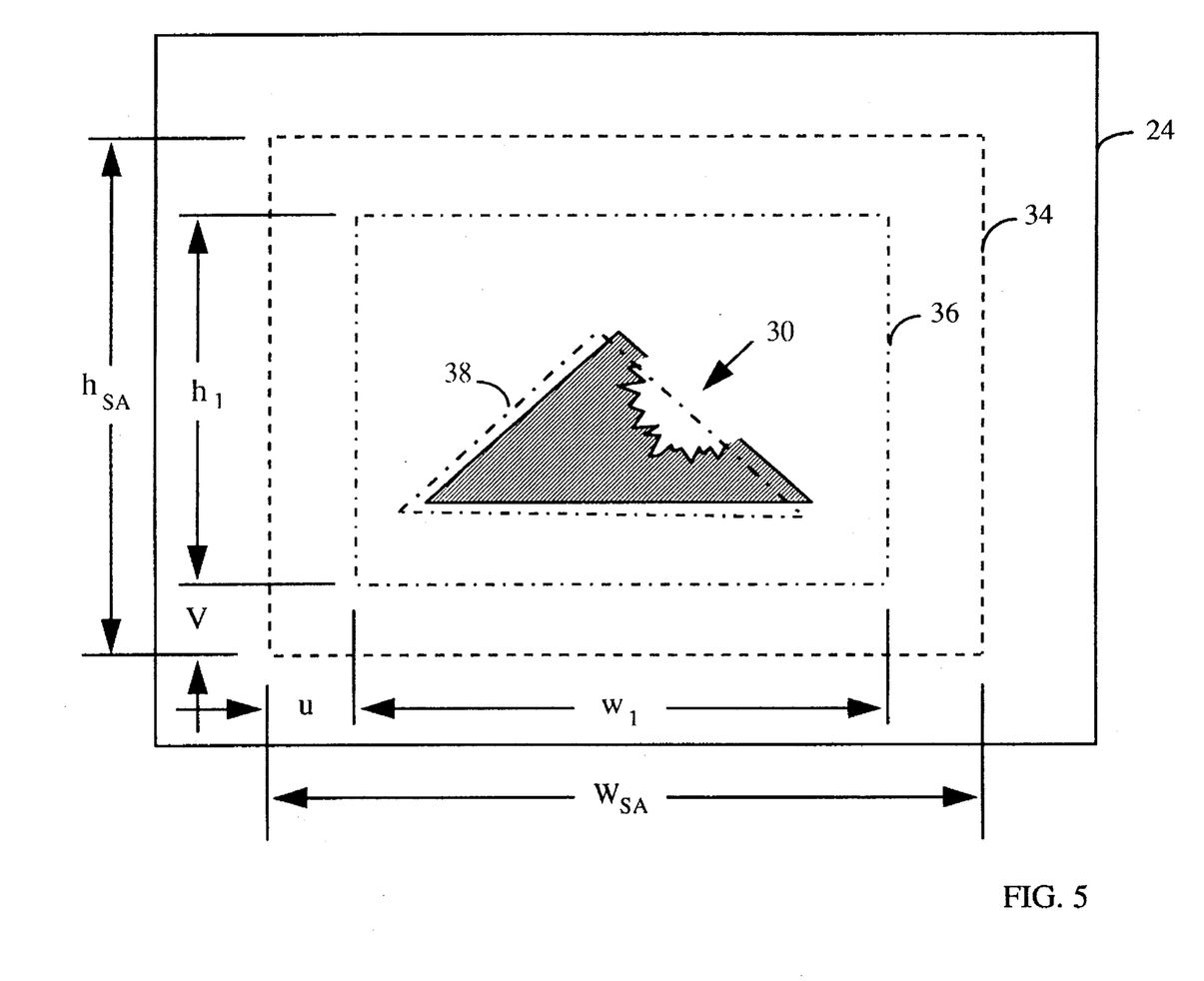
FIG. 5 includes all of FIG. 3, also showing the dimensions $w_1$ and $h_1$ of the first image, the dimensions $W_{SA}$ and $h_{SA}$ of the search area of the second image, and the extent of the relative displacement therebetween as represented by the variables u and v.

FIG. 5 illustrates an initial relative displacement, and shows how a relative displacement can be specified using the variables u and v. When u and v are both equal to zero, the lower left corner of the first image is flush in the lower left corner of the search area 32. Conversely, when u and v assume their maximum values of $W_{SA}-W_1$ and $h_{SA}-h_1$, respectively, the upper right corner of the first image is flush in the upper right corner of the search area 32. Here, $W_{SA}$ is the width of the search area 32, $w_1$ is the width of the first image, $h_{SA}$ is the height of the search area 32, and $h_1$ is the height of the first image, each dimension being shown in FIG. 5.

Figure 6:
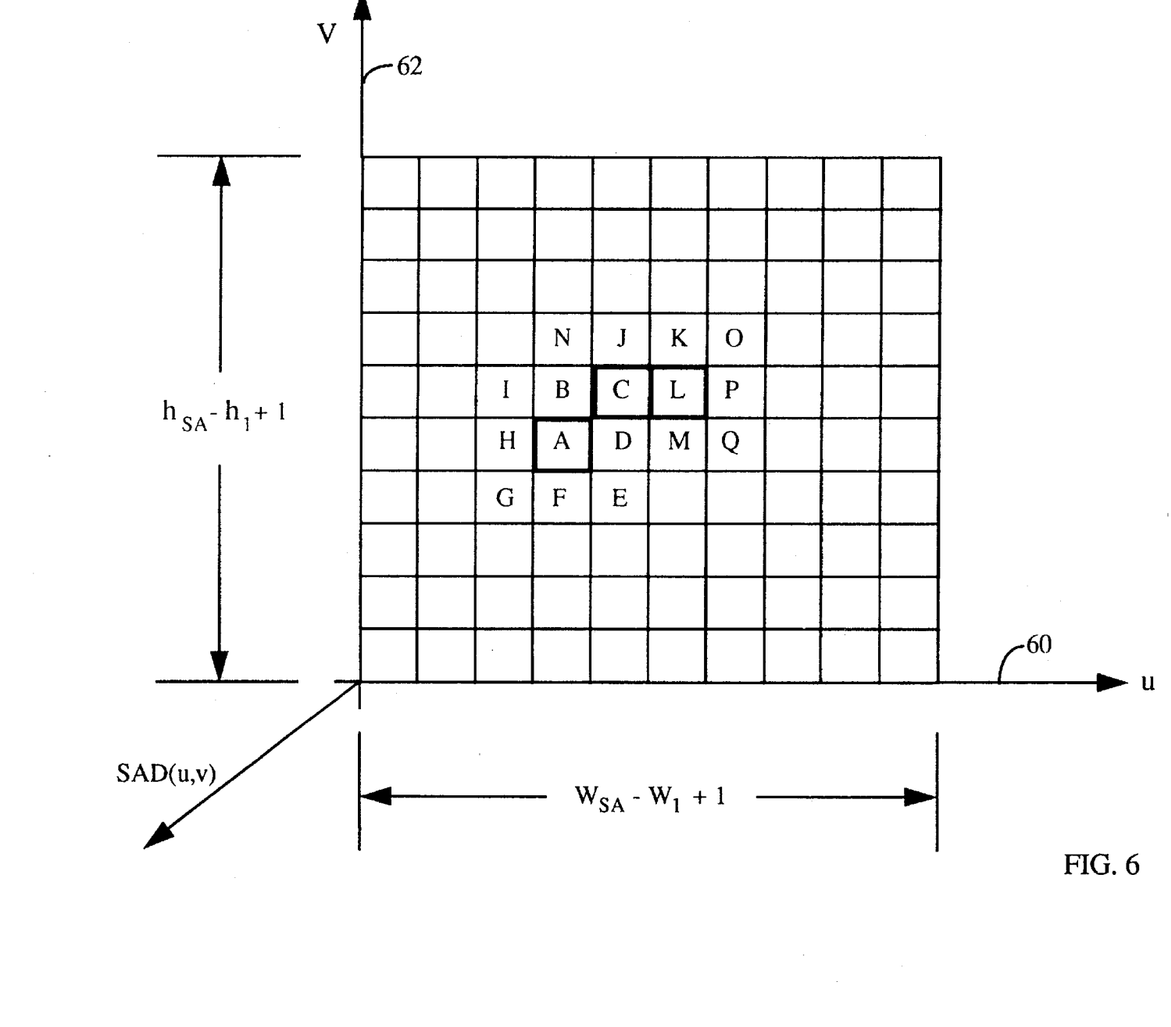
FIG. 6 is a graph of the variables u and v of FIG. 4, each being quantized according to a size of the pixels of the first and second images, and a metric surface variable Muv, that is a function of the variables u and v, also showing a plurality of relative displacement positions A through Q.

Referring again to FIG. 4, and also to FIG. 6, in the next step (44), a registration metric value is computed for the image pair in the initial relative displacement position using a linear registration metric computation, such as the Sum of Absolute Differences metric SAD(u,v) of Equation (3), which is a function of u and v, i.e., the relative displacement between the first and second images M and I. In FIG. 6, the initial relative displacement position is marked with the letter 'A', and is characterized by a discrete value of u and a discrete value of v. The value of the metric SAD(u,v) can be represented as the height above the plane defined by the u and v axes 60 and 62, respectively. Thus, the range of values of the metric SAD(u,v) over the domains of u and v ($W_{SA}-w_1+1$ and $h_{SA}-h_1+1$, respectively) can be viewed as being a surface. This surface (not shown) can have both minima and maxima, which can be either local or global. (By definition, a global minimum is the lowest minimum among all the local minima.)

To implement the metric of Equation (3), the difference is computed between the gray value of each pixel of the first image and the gray value of the pixel of the second image that is in overlapping relationship with the each pixel of the first image. Next, the absolute value of the difference is computed, which step can advantageously be executed using specialized computational circuitry that has been engineered to perform this type of calculation more rapidly than a general-purpose microprocessor, such as the "VC-2" chip, by Cognex Corporation, Natick Mass.

Next, the sum of absolute differences is obtained by computing the summation of each absolute value computed for each pixel of the first image that is in overlapping relationship with a pixel of the second image. This step of "computing the summation of each absolute value" can advantageously be executed within specialized computational circuitry that has been engineered to perform this type of calculation more rapidly than a general-purpose microprocessor, such as the "VC-1" or the "VC-3" chip, each also by Cognex Corporation.

The sum of absolute differences that is computed for the initial relative displacement is a single number that represents how well the first image is registered with respect to the second image at that particular relative displacement.

In the next step (46), a registration metric value is computed for each of a plurality of neighboring-pixel displacements using the registration metric computation of Equation (3). For example, in FIG. 6, the initial relative displacement A is surrounded by a plurality of neighboring-pixel relative displacements B, C, D, E, F, G, H, and I. In an alternate embodiment, only B, D, F, and H are used. In general, "neighboring-pixel displacements" can include pixels that are more than one pixel away from the initial relative displacement.

The next step (48) is to determine which displacement among the plurality of neighboring-pixel relative displacements and the initial relative displacement resulted in the smallest registration metric value. If the displacement that resulted in the smallest registration metric value is one of the plurality of neighboring-pixel displacements, steps (44), (46), and (48) are repeated, one of the neighboring-pixel displacements is used as the initial relative displacement, as shown in step (50). For example, in FIG. 6, the relative displacement C is used as the initial relative displacement in step (44), and then the relative displacements labeled by J, K, L, M, D, A, B, and N are treated as the neighboring-pixel relative displacements in step (46). Similarly, in a subsequent iteration, the relative displacement L can then be used as the initial relative displacement in step (44), and then the relative displacements labeled by K, O, P, Q, M, D, C, and J are treated as the neighboring-pixel relative displacements in step (46).

If the initial relative displacement A has a lower registration metric value than any of the plurality of neighboring pixel displacements, then the registration metric value represents at least a local minimum in the possible values of SAD(u,v), and the initial relative displacement A would probably at least provide adequate registration. Consequently, registration parameters for placing the pair of digitized images in registered relationship according to the initial relative displacement A would be returned, as shown in step (52).

In a preferred embodiment, the registration parameters can be used for computing sub-pixel registration parameters using, for example, parabolic interpolation. A preferred method of sub-pixel registration includes considering five difference metric values: the metric value at the final initial relative displacement, and the metric values of the four neighboring-pixel relative displacements immediately above, below, right, and left of the final initial relative displacement. These values are used to independently calculate the sub-pixel offsets along the u and v axes 60 and 62, respectively. Specifically, along the u axis, the final initial relative displacement and its left and right neighboring pixel displacements are used. A parabola is then "fit" to the points, and the minimum of that parabola is found, using techniques well-known in the art. The u-coordinate of the minimum is the sub-pixel registration parameter along the u-axis 60. An analogous approach is taken to find the v-coordinate of the sub-pixel registration parameter. Of course, other interpolation methods can be used, such as bi-linear or cubic interpolations, and larger "supports" could be used, such as using more than four neighboring-pixel relative displacements.

In applications where registration is performed for the purpose of flaw or defect detection, instead of, or in addition to, returning registration parameters (52), a difference image can be generated by subtracting the first image from the second image, or vice versa. The difference image can then be used to detect defects, or measure the size, shape, and/or position of flaws. Sub-pixel interpolation can be performed before or after the image subtraction step, depending on the application. For example, in a Golden Template analysis, the sub-pixel interpolation would be performed before subtracting.

In a preferred embodiment, the second image is at least as large as the first image, and the initial relative displacement between the first image and the second image is selected such that each of the pixels of the first image is in overlapping relationship with at least one pixel of the second image.

Referring to FIG. 6, efficiencies in execution speed can be achieved by avoiding repetitious calculation of the registration metric values. Specifically, if the metric values are stored in association with the relative displacement upon which the value is based, then upon a subsequent iteration when a different pixel is used as the initial relative displacement, the metric value for relative displacements that have already been calculated can be retrieved from memory, rather than recalculate them. For example, when pixel A is the initial relative displacement, the metric values for the pixels B, C, D, E, F, G, H, and I are also calculated. Thus, when pixel C is the initial relative displacement, the metric values for pixels A, B, C, and D do not need to be recalculated if they have been previously stored.

In summary, the method and apparatus of the invention for efficient registration of a pair of digitized images obtains a registration metric value based upon the Sum of Absolute Differences registration metric computation for each of a plurality of neighboring-pixel relative displacements, and iteratively selects a new initial relative displacement from among the plurality of neighboring-pixel relative displacements such that each succeeding new initial relative displacement is associated with a smaller registration metric value, until an initial relative displacement that is associated with a minimum registration metric value is reached.

More generally, the relative displacement that is associated with a minimum registration metric value is located using a two-dimensional numerical optimization analysis. In a preferred embodiment, the two-dimensional numerical optimization analysis is a gradient descent analysis, one version of which has been described above, and in another preferred embodiment, the two-dimensional numerical optimization analysis is a steepest descent analysis.

The invention is especially useful for use in flaw and defect analysis, such as Golden Template Analysis, third optical inspection, as well as pair-wise comparison of die images on a semiconductor wafer.

Other modifications and implementations will occur to those skilled in the art without departing from the spirit and the scope of the invention as claimed. Accordingly, the above description is not intended to limit the invention except as indicated in the following claims.

What is claimed is:

1. A method for efficient registration of a pair of digitized images including a first image and a second image, each image including a plurality of pixels, each pixel being associated with at least one of a gray value and a don't-care symbol, the method comprising the steps of:

(A) selecting an initial relative displacement between said first image and said second image such that a plurality of pixels of said first image are in overlapping relationship with a plurality of pixels of said second image;

(B) computing a registration metric value corresponding to said initial relative displacement using a registration metric computation that includes the steps of:

computing the difference between the gray value of each pixel of said first image and the gray value of the pixel of said second image that is in overlapping relationship with said each pixel of said first image;

computing the absolute value of the difference between the gray value of each pixel of said first image and the gray value of each pixel of said second image that is in overlapping relationship with said each pixel of said first image; and computing a sum of absolute differences by computing the summation of each absolute value computed for each pixel of said first image that is in overlapping relationship with a pixel of said second image;

(C) computing a registration metric value corresponding to each of a plurality of neighboring-pixel displacements using said registration metric computation;

(D) determining which displacement among the plurality of neighboring-pixel displacements and said initial relative displacement resulted in the smallest registration metric value;

(E) if the displacement that resulted in the smallest registration metric value is one of said plurality of neighboring-pixel displacements, repeating steps (A), (B), (C), (D), and (E) using said one displacement as said initial relative displacement; and (F) else, provide registration parameters corresponding to the most recent version of said initial relative displacement for placing said pair of digitized images in registered relationship.

2. The method of claim 1, further including the step of: using said registration parameters for computing sub-pixel registration parameters.

3. The method of claim 1, further including the step of:

after step (E), if the displacement that resulted in the smallest registration metric value is not one of said plurality of neighboring-pixel displacements, calculating a difference image based on a difference between said first image and said second image, wherein said first and second images are relatively displaced according to said most recent version of said initial relative displacement.

4. The method of claim 1, wherein said second image is at least as large as said first image, and said initial relative displacement between said first image and said second image is selected such that each of the pixels of said first image is in overlapping relationship with at least one pixel of said second image.

5. The method of claim 1, wherein said first image includes a region that includes a first plurality of pixels, each pixel of said first plurality of pixels being associated with a gray value, and wherein said region is bounded by at least a second plurality of pixels, each pixel of said second plurality of pixels being associated with a don't-care symbol.

6. The method of claim 1, further including the steps of:

selecting a search area within said second image, said search area being defined by a search area boundary that can enclose as many as all of the pixels of said second image, and wherein step (E) further includes the step of:

if the displacement that resulted in the smallest registration metric value falls outside of the search area boundary, providing registration parameters corresponding to the most recent version of said initial relative displacement for placing said pair of digitized images in registered relationship.

7. The method of claim 1, further including the steps of:

after step (B), storing said registration metric value in association with said initial relative displacement; and after step (C), storing each said registration metric value in association with a corresponding neighboring-pixel displacement, and wherein in step (E), whenever steps (A), (B), (C), (D), and (E) are repeated, a registration metric value for a relative displacement is calculated only if a registration metric value has not been previously calculated and stored in association with said relative displacement.

8. The method of claim 1, wherein said initial relative displacement between said first image and said second image is such that a first pixel that contains the centroid of said first image is in overlapping relationship with a second pixel that contains the centroid of said second image.

9. The method of claim 1, wherein the step of computing a registration metric value corresponding to each of a plurality of neighboring-pixel relative displacements is computed for the contiguous north, east, south, and west neighboring-pixel relative displacements.

10. The method of claim 1, wherein the step of computing a registration metric value corresponding to each of a plurality of neighboring-pixel relative displacements is computed for the contiguous north, east, south, west, north-east, south-east, south-west, and north-west neighboring-pixel relative displacements.

11. A method for efficient registration of a pair of digitized images including a first image and a second image, each image including a plurality of pixels, each pixel being associated with at least one of a gray value and a don't-care symbol, the method comprising the steps of:

(A) selecting an initial relative displacement between said first image and said second image such that a plurality of pixels of said first image are in overlapping relationship with a plurality of pixels of said second image;

(B) computing a registration metric value corresponding to said initial relative displacement using a Sum of Absolute Differences registration metric computation;

(C) obtaining a registration metric value based upon said Sum of Absolute Differences registration metric computation for each of a plurality of neighboring-pixel relative displacements, and iteratively selecting a new initial relative displacement from among said plurality of neighboring-pixel relative displacements such that each succeeding new initial relative displacement is associated with a smaller registration metric value, until an initial relative displacement that is associated with a minimum registration metric value is reached.

12. The method of claim 11, further including the step of:

based upon said initial relative displacement that is associated with a minimum registration metric, computing sub-pixel registration parameters.

13. The method of claim 11, further including the step of:

upon reaching said initial relative displacement that is associated with a minimum registration metric, calculating a difference image based upon a difference between said first image and said second image, wherein said first and second images are relatively displaced according to said initial relative displacement.

14. The method of claim 11, wherein the step of obtaining said registration metric value includes the steps of:

calculating a registration metric value for a relative displacement based upon said Sum of Absolute Differences registration metric computation only if a registration metric value has not already been calculated and previously stored in association with said relative displacement.

15. The method of claim 11, wherein said second image is at least as large as said first image, and said initial relative displacement between said first image and said second image is selected such that each of the pixels of said first image is in overlapping relationship with at least one pixel of said second image.

16. The method of claim 11, wherein said first image includes a region that includes a first plurality of pixels, each pixel of said first plurality of pixels being associated with a gray value, and wherein said region is bounded by at least a second plurality of pixels, each pixel of said second plurality of pixels being associated with a don't-care symbol.

17. The method of claim 11, further including the step of:

selecting a search area within said second image, said search area being defined by a search area boundary that can enclose as many as all of the pixels of said second image, and wherein the step of iteratively computing a registration metric value also terminates when a succeeding new initial relative displacement falls outside of the search area boundary, whereupon registration parameters are provided corresponding to the most recent version of said initial displacement that does not fall outside of the search area boundary.

18. The method of claim 11, further including the step of:

(D) providing registration parameters corresponding to the version of said initial displacement that is associated with said minimum registration metric value.

19. The method of claim 11, wherein said minimum registration metric value is a local minimum registration metric value.

20. The method of claim 11, wherein said initial relative displacement between said first image and said second image is such that a first pixel that contains the centroid of said first image is in overlapping relationship with a second pixel that contains the centroid of said second image.

21. The method of claim 11, wherein the step of computing a registration metric value corresponding to each of a plurality of neighboring-pixel relative displacements is computed for the contiguous north, east, south, and west neighboring-pixel relative displacements.

22. The method of claim 11, wherein the step of computing a registration metric value corresponding to each of a plurality of neighboring-pixel relative displacements is computed for the contiguous north, east, south, west, north-east, south-east, south-west, and north-west neighboring-pixel relative displacements.

23. A method for efficient registration of a pair of digitized images including a first image and a second image, each image including a plurality of pixels, each pixel being associated with at least one of a gray value and a don't-care symbol, the method comprising the steps of:

(A) selecting an initial relative displacement between said first image and said second image such that a plurality of pixels of said first image are in overlapping relationship with a plurality of pixels of said second image;

(B) computing a registration metric value corresponding to said initial relative displacement using a Sum of Absolute Differences registration metric computation;

(C) locating a relative displacement that is associated with a minimum registration metric value using a two-dimensional numerical optimization analysis.

24. The method of claim 23, further including the step of:

based on said relative displacement that is associated with said minimum registration metric value, computing sub-pixel registration parameters.

25. The method of claim 23, further including the step of:

after step (C), calculating a difference image based upon a difference between said first image and said second image, wherein said first and second images are relatively displaced according to said relative displacement that is associated with said minimum registration metric value.

26. The method of claim 23, step (C) further including the step of:

calculating a registration metric value for a relative displacement based upon said Sum of Absolute Differences registration metric computation only if a registration metric value has not already been calculated and previously stored in association with said relative displacement.

27. The method of claim 23, wherein said second image is at least as large as said first image, and said initial relative displacement between said first image and said second image is selected such that each of the pixels of said first image is in overlapping relationship with at least one pixel of said second image.

28. The method of claim 23, wherein said first image includes a region that includes a first plurality of pixels, each pixel of said first plurality of pixels being associated with a gray value, and wherein said region is bounded by at least a second plurality of pixels, each pixel of said second plurality of pixels being associated with a don't-care symbol.

29. The method of claim 23, further including the step of:

selecting a search area within said second image, said search area being defined by a search area boundary that can enclose as many as all of the pixels of said second image, and wherein said relative displacement, of the step of locating a relative displacement that is associated with a minimum registration metric value, does not fall outside of the search area boundary.

30. The method of claim 23, wherein said two-dimensional numerical optimization analysis is a gradient descent analysis.

31. The method of claim 23, wherein said two-dimensional numerical optimization analysis is a steepest descent analysis.

32. Apparatus for efficient registration of a pair of digitized images including a first image and a second image, each image including a plurality of pixels, each pixel being associated with at least one of a gray value and a don't-care symbol, the apparatus comprising:

(A) means for selecting an initial relative displacement between said first image and said second image such that a plurality of pixels of said first image are in overlapping relationship with a plurality of pixels of said second image;

(B) means for computing a registration metric value corresponding to said initial relative displacement using a Sum of Absolute Differences registration metric computation;

(C) means for locating a relative displacement that is associated with a minimum registration metric value using a two-dimensional numerical optimization analysis.

33. The apparatus of claim 32, wherein said means for computing a registration metric value comprises:

means for computing the absolute value of the difference between the gray value of each pixel of said first image and the gray value of each pixel of said second image that is in overlapping relationship with said each pixel of said first image; and means, in communication with said means for computing the absolute value, for computing a sum of absolute differences by computing the summation of each absolute value computed for each pixel of said first image that is in overlapping relationship with a pixel of said second image.

* * * * *